United States Patent [19]

Hsu

[11] 4,162,504
[45] Jul. 24, 1979

[54] FLOATING GATE SOLID-STATE STORAGE DEVICE

[75] Inventor: Sheng T. Hsu, Lawrenceville, N.J.

[73] Assignee: RCA Corp., New York, N.Y.

[21] Appl. No.: 864,766

[22] Filed: Dec. 27, 1977

[51] Int. Cl.² .............................................. H01L 29/78
[52] U.S. Cl. ........................................ 357/23; 357/54; 357/59
[58] Field of Search ............................... 357/23, 59, 54

[56] References Cited

U.S. PATENT DOCUMENTS 3,984,822  10/1976  Simko et al. ............................ 357/59
4,057,820  11/1977  Gallagher ............................... 357/23

Primary Examiner—Edward J. Wojciechowicz
Attorney, Agent, or Firm—H. Christoffersen; D. S. Cohen; L. P. Benjamin

[57] ABSTRACT

A floating gate semiconductor device is described wherein the floating gate member does not extend completely across the channel region and thus avoids alignment with the edges of the source and drain regions. The lateral displacement of the edge of the floating gate from the drain region permits stored charge on the drain to be undisturbed in the event avalanche breakdown occurs at the channel-drain junction.

14 Claims, 2 Drawing Figures

FLOATING GATE SOLID-STATE STORAGE DEVICE

This invention relates, in general, to memory devices and more particularly to a novel electrically alterable floating gate device.

The computer and related arts have long required read only memory elements that were non-volatile and the prior art has provided many devices which, to some extent, attempted to fill this need. However, as the computer art has progressed in complexity there now exists a need to provide electrically alterable read only memories that may be programmed (or "written") and, if the occasion arises, to reprogram (erase and write) in the field. To this end, devices are presently available that exhibit non-volatile characteristics but, as will be discussed, have inherent shortcomings that are overcome by the subject invention.

At one end of the spectrum of semiconductor memory devices is the family of Floating-Gate-Avalanche-Metal-Oxide-Semiconductor (FAMOS) devices while the other end is represented by the family of Metal-Nitride-Oxide-Semiconductor (MNOS) devices. The advantages of both types of devices resides in the fact that they are independent of any outside current to maintain the stored information in the event power is lost and, since they are independent, there is no need for any further refreshing of the devices. Hence, there is a significant saving in power.

The floating gate family of devices usually has source and drain regions of one conductivity formed in a substrate of the opposite conductivity, at the surface thereof. Between the source and drain regions, and on the surface of the substrate, a gate structure is formed by first applying a thin insulating layer. A conductive layer is placed over the insulating layer (the floating gate) and a second insulating layer is formed to completely surround the floating gate and insulated it from the remainder of the device. A second conductive layer (the control gate) is then formed atop the second insulating layer. These floating gate devices which are exemplified in U.S. Pat. Nos. 3,500,142 and 3,755,721, have inherent drawbacks in that high fields are required to produce the necessary avalanche breakdown so that a charge will appear on the floating gate. Further, to erase the charge appearing on the floating gate, the entire device must be flooded with energy in the ultra-violet or x-ray portion of the spectrum. Thus, it is extremely difficult to erase a "word" without erasing all the charge on the device requiring it to be completely reprogrammed.

The MNOS type family of devices has the usual source and drain regions of one conductivity formed in a substrate of the opposite conductivity, at the surface thereof. Between the source and drain regions, and on the surface of the substrate, the gate structure is formed by first applying a thin insulating layer of, for example, silicon oxide. However, as distinguished from the floating gate type device, this family of MNOS devices is provided with a layer of material having a high charge trapping characteristic, such as silicon nitride ($Si_3N_4$) followed by a second metallic layer that is formed atop the nitride layer. For very low voltage applications this type of device finds extensive use in the art. However, one serious defect that manifests itself is the tendency toward zener breakdown, at the drain-substrate junction, at low voltages. Further, after a relatively short number of charge and discharge (write and erase) cycles has been accomplished, the user is faced with a radical change in threshold voltage, a situation which, in many instances, may require the replacement of the MNOS device.

In accordance with the invention, a memory type floating gate device is described having the relatively long retention time of a floating gate device yet may be written and erased with the same ease as an MNOS device. This is accomplished by providing my device with a floating gate that is narrower than that used in the prior art and accurately locating it in the channel area between, and spaced from, the source and drain. By carefully controlling the thickness of the insulator layer that extends beyond the extremities of the floating gate, between the source and drain regions, I am able to produce a novel electrically programmable floating gate device that may be as easily written and erased as an MNOS device yet has the storage retention characteristics of a floating gate type device.

Figure 1:
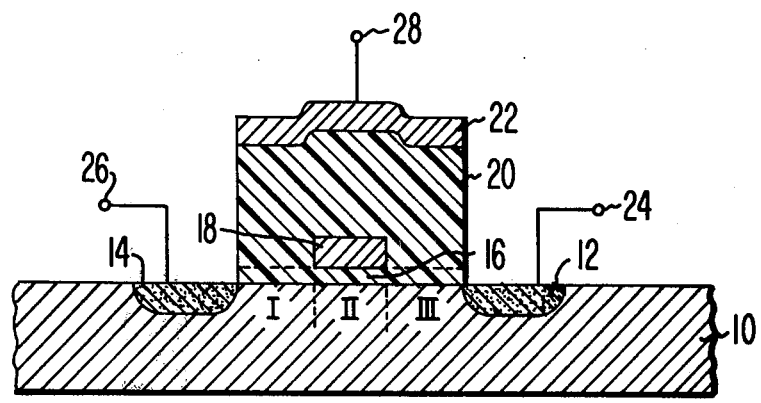
FIG. 1 is a cross-sectional view of one embodiment of a floating gate device built in accordance with the teaching of the present invention using bulk silicon as the substrate.

Referring now to FIG. 1, one embodiment of my novel device is disclosed using bulk type silicon, as substrate 10, and which may be of any type of crystal orientation. Within substrate 10, and at the surface thereof, there is shown a pair of opposite conductivity regions 12 and 14, which represent the drain and source regions respectively, and which may be formed by diffusion or implantation. As is generally known in the art, source electrode 14 is the one into which majority carriers are introduced while drain electrode 12 is the one from which majority carriers are derived. The channel region (shown here as comprising regions I, II and III) is defined by the inner extremities of the drain and source regions. The gate structure is formed over the channel region and consists of a first insulating layer 16, which may for example be a layer of thermally grown silicon oxide having a thickness of about 100–200Å. Thereafter, floating gate 18, consisting of a conductive layer of polysilicon, is deposited to a thickness of about 2000–3000Å over gate oxide layer 16. It should be here noted that the length of the floating gate 18 is marketedly narrower than the width of the channel region lying thereunder. Typically, the width of the channel region may be about 16 microns while the minimum length of regions I and III may range from about 0.5 to 1.0 microns.

By way of example, floating gate 18 may be formed by first coating the entire surface of gate oxide layer 16 with polysilicon, masking the desired dimensions and then removing the unwanted portions by means of a potassium hydroxide solution. Thereafter, the gate structure is provided with another layer of thermally grown gate oxide 20, which is deployed over both floating gate 18 and gate oxide layer 16, to a thickness of about 700 to 800Å. Those portions of oxide layer 16 not subtended by floating gate 18 (namely zones I and III) will be combined with gate oxide 20 to form an insulating barrier of about 900–1000Å thick. The gate structure is completed by depositing a layer of about 3000 to 5000Å of polysilicon to form control gate 22. To complete the device ohmic contacts are made to drain 12, source 14 and control gate 22 and are shown symbolically at 24, 26 and 28, respectively.

Figure 2:
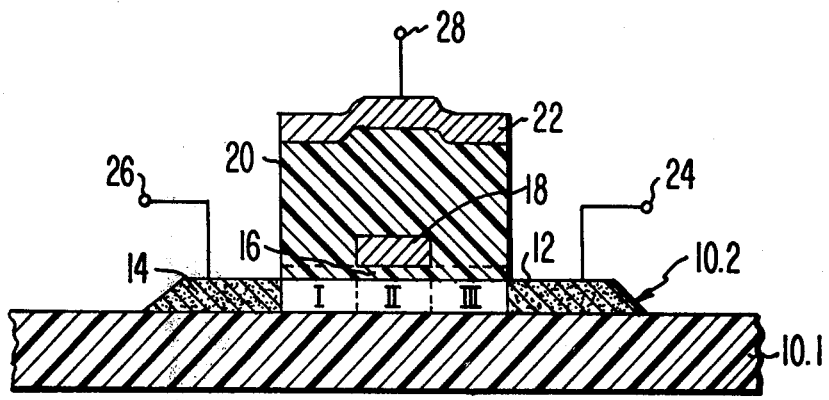
FIG. 2 is a cross-sectional view of another embodiment of a floating gate device built in accordance with the teaching of the present invention using a silicon on a sapphire substrate.

Referring now to FIG. 2, there is shown another embodiment of my invention, this embodiment utilizing the well-known silicon-on-sapphire (SOS) technique of forming a device. Further, it should be noted that similar elements will be similarly numbered to that of FIG. 1. In this embodiment, an island of intrinsic silicon 10.2 is grown in the standard manner, on a sapphire substrate 10.1. After suitably masking and doping, by any one of many well-known techniques, drain 12 and source 14 regions are formed with the channel region therebetween and consists of regions I, II and III. As is usual, drain 12 and source 14 are of one conductivity while the channel region (regions I, II and III) is of an opposite type conductivity. The channel region extends between the inner extremeties of drain region 12 and source region 14. As in the embodiment of FIG. 1, the gate structure is formed over the channel region and consists of a first insulating layer 16 such as, for example, thermally grown silicon oxide having the thickness of about 100–200Å. Once oxide layer 16 has been formed over the channel region, a floating gate 18, consisting of a conductive layer of polysilicon, is deposited to a thickness of about 2000–3000Å over gate oxide layer 16. It should be here noted that, as in the previous embodiment, the length of floating gate 18 is marketedly narrower than the width of the channel region lying thereunder. The dimensions of floating gate 18, with respect to the channel region, are the same as in the previous embodiment.

Floating gate 18 may be formed by first coating the entire exposed surface of gate oxide layer 16 with polysilicon, masking the desired dimension and then removing the unwanted portions with a potassium hydroxide solution. Thereafter, the gate structure is provided with a second layer of gate oxide 20 which is deployed to a thickness of about 700–800Å over floating gate 18. Oxide layer 20 is also deposited over gate oxide layer 16 to completely encase and cover both floating gate 18 and those portions of oxide layer 16 not subtended by floating gate 18. The oxide thickness of layer 20, lying over regions I and III will have a thickness of about 900–1000Å. The gate structure may then be completed by the deposition of a layer of about 3000–5000Å of polysilicon to form control gate 22.

The floating gate device described in FIGS. 1 and 2, when constructed in accordance with the suggested dimensions, will thus provide the user with a semiconductor device having a control gate (22), a floating gate (18), a thickness of gate oxide under the floating gate of about 100Å and an oxide thickness beyond the edges of the floating gate (between the control gate and the surface of substrate 10) of approximately 900–1000Å. These oxide thicknesses will affect the threshold voltage and the voltage required to write and/or erase the memory but will not affect the basic principles of operation of my device. The control gate 22 has been made to extend beyond the floating gate at regions I and III and it is the overlap of control gate 22 over these latter two regions that provides a fixed, high conductive threshold voltage and a high drain breakdown voltage as characteristic of MNOS devices. Since floating gate 18 is laterally displaced from the junction formed by the channel and drain regions, any charge written into floating gate 18 will not be disturbed in the event avalanche breakdown should occur at the channel-drain junction.

In operation, the user has the option of alternate methods of writing (programming) a charge on floating gate 18. In one method, a writing potential of about −30 volts is applied to control gate 22 while drain and source electrodes 12 and 14, respectively, are maintained at ground or at zero potential. In the alternative, it has been found that by applying −15 volts to control gate 22 and +15 volts to drain electrode 12, while source electrode 14 is allowed to float, a charge will be stored or written on floating gate 18. To erase (preparatory to writing or rewriting) any charge appearing on floating gate 18, it is merely necessary to apply a potential of about +30 volts to control gate 22 while maintaining source 14 and drain 12 at zero voltage potential (ground). As an alternative method of erasing, it is merely necessary to provide control gate 22 with a potential of about +15 volts, while maintaining −15 volts on drain 12 and allowing source electrode 14 to float.

While FIGS. 1 and 2 have been described in terms of structure and operation of a P-channel device, it will be obvious to those skilled in the semiconductor art that this is only by way of example since the conductivities of the various elements may be changed without departing from the inventive concept. Similarly, while enhancement mode type devices are shown, depletion type devices, having similar characteristics, may be substituted to achieve the same results. Further, while the embodiment of FIG. 2 has been described using sapphire as an insulative substrate, it should now become obvious that, while sapphire is preferred, other similar materials such as spinel or beryllium oxide may be used with no deleterious effects.

What is claimed is:

1. A floating gate storage device comprising:
    a body of semiconductor material having a pair of semiconductor regions of a first type of conductivity embedded therein and spaced a given distance one from the other;
    an intermediate semiconductor region of an opposite type conductivity defining the space between the pair of regions;
    a first layer of insulating material having a given thickness disposed on the intermediate region;
    a floating gate member, the width of which is narrower than the given distance between the regions of first conductivity, centrally disposed over the intermediate region and insulated therefrom by the first layer of insulating material;
    a second layer of insulating material having a greater thickness than that of the first insulating layer disposed on both the floating gate member and those portions of the first insulating layer not covered by the floating gate member; and
    a control gate member, the width of which is the same as the given distance between the regions of first conductivity, centrally disposed on the second insulating layer, over the intermediate region, and insulated from the floating gate member by the second layer of insulating material.

2. The storage device of claim 1, wherein:
    the body of semiconductor material is bulk silicon of the opposite type of conductivity.

3. The storage device of claim 2, wherein:
    the floating gate member is laterally spaced from at least one of the regions of first type conductivity no closer than a distance ranging from about 0.5 microns to about 1.0 microns.

4. The storage device of claim 3, wherein:
the floating gate member is laterally spaced from each of the regions of first type conductivity no closer than a distance ranging from about 0.5 microns to about 1.0 microns.

5. The storage device of claim 4, wherein:
one of the pair of regions of first type conductivity is a drain region from which majority carriers is derived; and
the floating gate member is laterally spaced no closer than a distance ranging from about 0.5 microns to about 1.0 microns from the drain region.

6. The storage device of claim 5, wherein:
the first layer of insulating material, underlying the gate member, is thermally grown silicon oxide having a thickness of about 100–200Å.

7. The storage device of claim 6, wherein:
the portion of the second layer of insulating material overlying only the floating gate member has a thickness of about 700–800Å;
the remaining portions of the second layer of insulating material overlying only the intermediate region has a thickness of about 900–1000Å; and
the floating gate member is electrically conductive and has a thickness of about 2000–3000Å.

8. The storage device of claim 1, wherein:
the first, second and intermediate regions are colocated in an island of silicon formed on an insulative substrate.

9. The storage device of claim 8, wherein:
the insulative substrate is selected from the group consisting of sapphire, spinel and beryllium oxide.

10. The storage device of claim 9, wherein:
the floating gate member is laterally spaced from at least one of the regions of first type conductivity no closer than a distance ranging from about 0.5 microns to about 1.0 microns.

11. The storage device of claim 10, wherein:
the floating gate member is laterally spaced from each of the regions of first type conductivity no closer than a distance ranging from about 0.5 microns to about 1.0 microns.

12. The storage device of claim 11, wherein:
one of the pair of regions of first type conductivity is a drain region from which majority carriers are derived; and
the floating gate member is laterally spaced no closer than a distance ranging from about 0.5 microns to about 1.0 microns from the drain region.

13. The storage device of claim 12, wherein:
the first layer of insulating material, underlying the gate member, is thermally grown silicon oxide having a thickness of about 100–200Å.

14. The storage device of claim 13, wherein:
the portion of the second layer of insulating material overlying only the floating gate member has a thickness of about 700–800Å;
the remaining portions of the second layer of insulating material overlying only the intermediate region has a thickness of about 900–1000Å; and
the floating gate member is electrically conductive and has a thickness of about 2000–3000Å.

* * * * *

Disclaimer 4,162,504.—*Sheng T. Hus,* Lawrenceville, New Jersey, FLOATING GATE SOLID-STATE STORAGE DEVICE. Patent dated July 24, 1979. Disclaimer filed Aug. 2, 1982, by the assignee, *RCA Corp.*

Hereby enters this disclaimer to claims 1-7 of said patent.

[*Official Gazette October 26, 1982.*]